United States Patent [19]

Hasbun et al.

[11] Patent Number: 5,544,312

[45] Date of Patent: Aug. 6, 1996

[54] METHOD OF DETECTING LOSS OF POWER DURING BLOCK ERASURE AND WHILE WRITING SECTOR DATA TO A SOLID STATE DISK

[75] Inventors: Robert N. Hasbun, Shingle Springs; Mark Christopherson, Folsom, both of Calif.

[73] Assignee: Intel Corporation, Santa Clara, Calif.

[21] Appl. No.: 235,170

[22] Filed: Apr. 29, 1994

[51] Int. Cl.$^6$ .................................................. G06F 11/00
[52] U.S. Cl. ............................. 395/183.18; 395/182.12
[58] Field of Search ....................... 371/66; 395/575, 395/182.12, 182.13, 182.16, 182.17, 182.18, 183.18, 182.22; 364/273.4

[56] References Cited

U.S. PATENT DOCUMENTS

| | | | |
|---|---|---|---|
| 3,859,638 | 1/1975 | Hume, Jr. | 340/173 R |
| 3,916,390 | 10/1975 | Chang et al. | 340/173 R |
| 5,195,100 | 3/1993 | Katz et al. | 371/66 |
| 5,353,265 | 10/1994 | Fandrich et al. | 365/230.03 |
| 5,369,754 | 11/1994 | Fandrich et al. | 395/425 |

*Primary Examiner*—Robert W. Beausoliel, Jr.
*Assistant Examiner*—Norman M. Wright
*Attorney, Agent, or Firm*—Blakely, Sokoloff, Taylor & Zafman

[57] ABSTRACT

A method of protecting the accuracy of sector of data while the writing the sector of data into a block of a solid state memory disk. First, a sector offset is written into the block to indicate where within the data space of the block the sector data will be located. Second, the sector of data is written into the block. Afterward, the logical sector number that identifies the sector of data is written into the block in two steps. The first step in writing the logical sector number is to write a selected invalid logical sector number into the block. Next, the selected invalid sector number is converted into the valid sector number by programming a power-off bit of the selected invalid logical sector number. Thus, whenever power to the solid state disk is next turned on, the loss of a sector of data and the validity of the sector of data can be determined. The loss of a sector of data is identified by locating a header in the block whose only valid data is the sector offset. The validity of a sector data can be determined by examining the logical sector number. Also described is a method of preventing the introduction of invalid data into the solid state disk as a result of loss of power during the erasure of a block.

11 Claims, 8 Drawing Sheets

METHOD OF DETECTING LOSS OF POWER DURING BLOCK ERASURE AND WHILE WRITING SECTOR DATA TO A SOLID STATE DISK

FIELD OF THE INVENTION

The present invention pertains to the field of computer storage systems. More particularly, the present invention pertains to a method of detecting loss of power during erasure of a block of a solid state memory array and while writing sector data.

BACKGROUND OF THE INVENTION

Most prior personal computers include many types of memory storage devices. Hard magnetic disk drives are used typically for mass storage, while different types of semiconductor memories are used for other purposes.

The non-volatility of hard magnetic disk drives is one of the chief reasons for their use. They may be turned on and off without loss of data. Hard drives store data on concentric tracks. Each track includes several sectors, each of which is typically 512 bytes in length.

Hard drives suffer from a number of disadvantages. Their size, their height in particular, often makes them unattractive for use in portable and lap top computers. The height of a hard disk drive has often been a limiting factor in attempts to reduce computer size to make computers more portable. Hard drives also consume relatively large amounts of power, which makes them even less attractive for computers that are battery powered.

Hard drives are less than ideal for use in computers that will be used out-of-doors. Magnetic disk drives are extremely sensitivity to vibration and shock. Additionally, magnetic drives do not tolerate well the dust and humidity of associated with much of the great outdoors.

Semiconductor memories, also referred to as solid state memories, do not suffer from many of the disadvantages of magnetic disk drives. They are small and rugged and consume significantly less power than magnetic drives.

One type of non-volatile semiconductor memory is the FLASH electrically erasable programmable read only memory (FLASH memory). FLASH memories can be programmed by the user and once programmed retain their data until erased. FLASH memories are erased by erasing a block of memory at a time. A block is a relatively large amount of data, 64 Kbytes or 65,536 bytes.

A FLASH memory cell is erased when the net charge on the floating gate is neutral. An erased FLASH bit is referred to as a "1." Conversely, a FLASH memory cell is programmed when the net charge on the floating gate is negative. A programmed FLASH bit is referred to as a "0." A FLASH memory cell cannot be reprogrammed without a prior erasure with one exception. Any FLASH bit can be programmed to a 0 at any time.

In some prior FLASH memories the programming and erasure is controlled internally by a write state machine or a command register. Internal control of programming and erasure lessens the knowledge and time required to program and erase the FLASH memories. However, FLASH erase time times remain relatively slow despite internal control. Erase cycle time is on the order one to two seconds.

SUMMARY OF THE INVENTION

A method of writing sector data into a nonvolatile memory array is described that provides mechanisms for detecting both lost sector data and invalid sector data. Each write begins by writing a sector offset, which points to the location of the sector data, into a header associated with the sector of data. If power is lost at this point, loss of the sector of data is detected when the header including only a valid sector offset is located. After writing the sector offset, the sector data is written into the data space of the nonvolatile memory array. The final task, writing into the header a logical sector number identifying the sector data, is accomplished in two steps. First, a selected invalid sector number is written into the header. Second, the selected invalid sector number is converted to a valid sector number. If power is lost before this conversion, the invalidity of the sector data can be determined by examining the logical sector number in the header.

Also to be described is a method of detecting the possible introduction of invalid data into a nonvolatile memory array as a result of loss of power during the erasure of the nonvolatile memory array. Power-off status bits are stored at a known and fixed location within the nonvolatile memory array and are used as indicators of whether the array power was turned-off while the array was being erased. If erasure occurred without power loss, the power-off status bits represent a first value. During an erase operation the value represented by the power-off status bits changes from the first value. Erasure of the array is followed by setting the power-off status bits to the first value. Thus, whenever power to the nonvolatile memory army is turned on, examination of the power-off status bits reveals whether power was lost while the array was being erased and thus whether array data is valid.

Other objects, features, and advantages of the present invention will be apparent from the accompanying drawings and the detailed description that follows.

BRIEF DESCRIPTION OF THE FIGURES

The present invention is illustrated by way of example and not by way of limitation in the figures of the accompanying drawings in which references indicate similar elements and in which.

DETAILED DESCRIPTION

I. Overview of Solid State Disk

Figure 1:
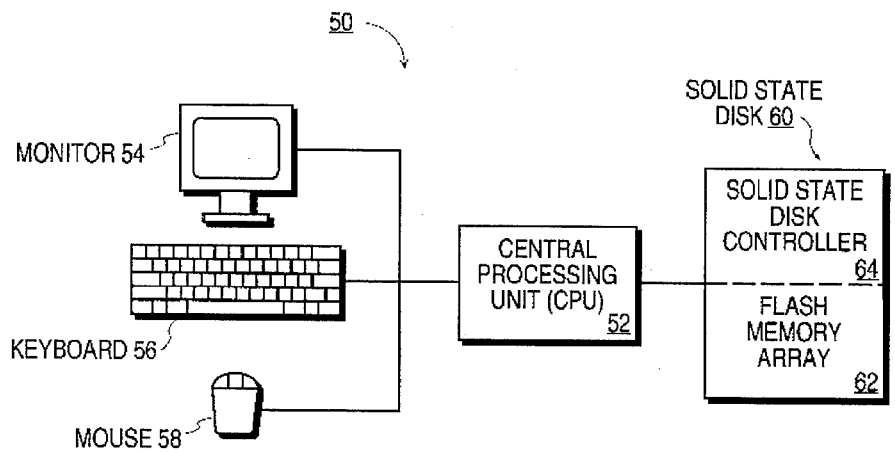
FIG. 1 is a block diagram of a personal computer including a solid state memory disk.

FIG. 1 illustrates in block diagram form personal computer 50. Personal computer 50 includes host central processing unit (CPU) 52 and monitor 54 for visually displaying information to a computer user. Keyboard 56 allows the computer user to input data to host CPU 52. By moving mouse 58 the computer user moves a pointer displayed on monitor 54. Personal computer 50 uses solid state memory disk 60 for mass memory storage. Solid state disk 60 includes solid state disk controller 64, which controls nonvolatile semiconductor memory array 62. Nonvolatile semiconductor memory array 62 is also referred to as FLASH array 62.

Solid state disk drive 60 achieves write speeds close to conventional magnetic disk drives by writing a sector of data to a new location each time the sector of data is revised, rather than erasing the previous physical location and writing the revised sector of data to that same physical location. As a result of this practice, solid state disk 60 soon stores a number of sectors of invalid user data, which are also referred to as dirty memory. Recovering the memory space occupied by dirty memory so that it can be reprogrammed again mandates clean-up. Stated slightly differently, the write practices of solid state disk controller 64 require that invalid user data be converted into free memory.

Clean-up is managed by a finite state machine, called a clean-up state machine. Clean-up requires moving sector data and block erasure. Loss of power during either of these clean-up tasks can introduce inaccuracies into sector data. Because the clean-up state machine runs in the background, the computer user is unaware of it and may power-down or remove the solid state disk 60 during clean-up. The methods of the present invention detect loss of power during erasure and while writing sector data so that inaccurate or invalid data is not introduced into solid state disk 60 and to prevent the loss of all data associated with a sector number.

II. FLASH Array and Block File Structure

Understanding the problems caused by loss of power during block erasure and while writing sector data is aided by a discussion of the program and erase characteristics of FLASH array 62. The FLASH devices within FLASH array 62 must be erased a block at a time, but can be programmed a bit at a time. Once programmed to a logic 0, a bit of FLASH memory cannot be programmed to a logic 1 without first erasing an entire block. Erased bytes of memory are referred to as "free" because they are ready to be written.

Erasure of FLASH memory is a slow process. Performing an erase each time a sector of data is written or revised is impractical. Writes would be slow because an entire block, 64 Kbytes, would have to be erased just to write one sector, 512 bytes. To allow rapid sector writes, solid state disk controller 64 writes each sector of data to a new, free location each time a sector of data is revised. As a result of this write practice there may be two or more versions of the sector data associated with a single sector number. The most recent version of the sector data is referred to as a "good sector," "valid sector" or a "user sector." The earlier version of the sector is marked dirty to indicate the sector data is no longer valid and will be marked "dirty" to indicate its invalidity.

Figure 2:
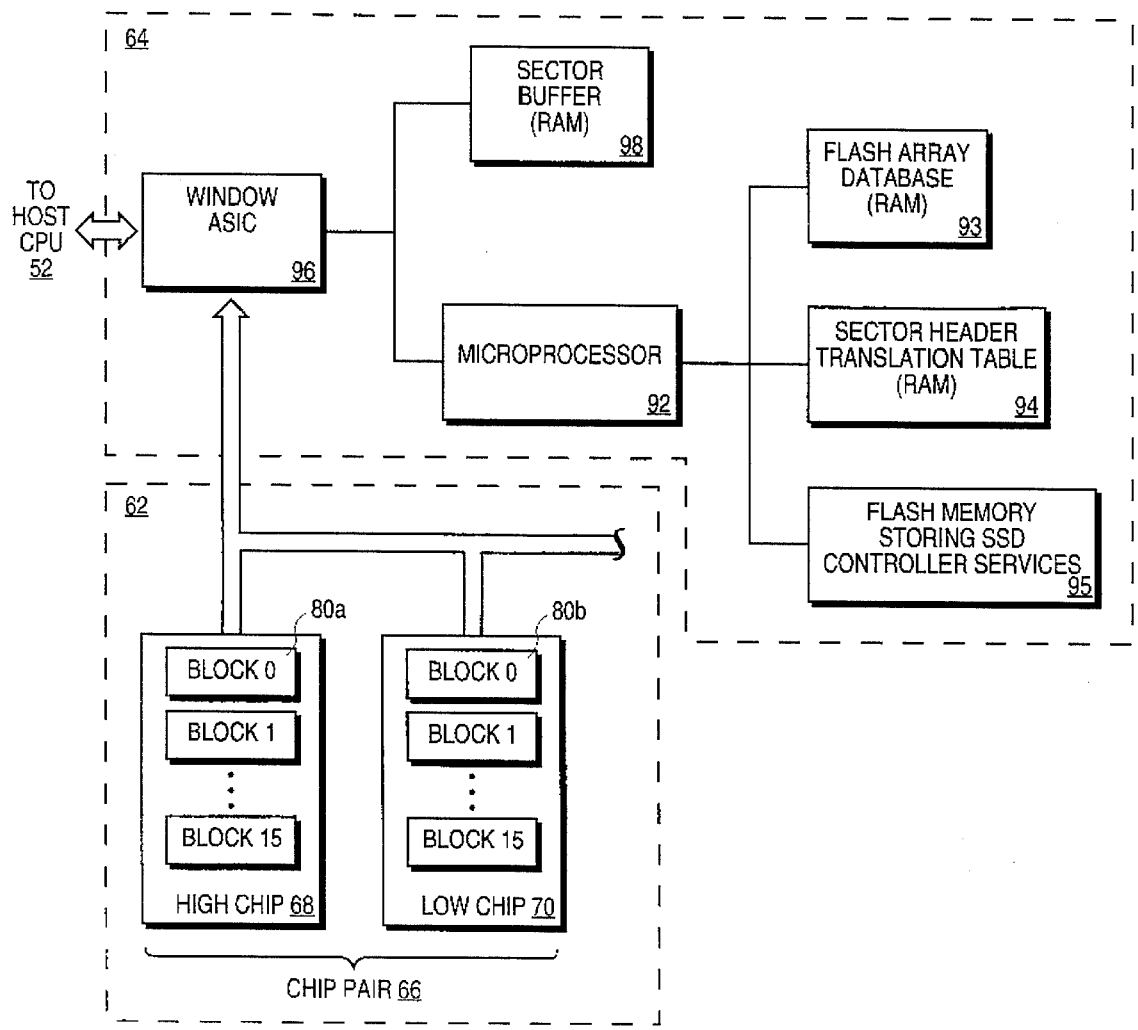
FIG. 2 is a block diagram of a solid state memory disk.

FIG. 2 illustrates in block diagram form FLASH array 62 and solid state disk controller 64. In one embodiment, FLASH array 62 uses several 1 megabyte, by 8, FLASH memory chips. Each FLASH chip inputs and outputs data 8 bits at a time. To permit word-wide input and output, FLASH array 62 is organized as pairs of FLASH devices, only one chip pair 66 of which is shown. High chip 68 of chip pair 66 stores the high byte of a word, while low chip 70 stores the lower byte of a word. Solid state disk controller 64 is thus able to treat each chip pair as a single 16 bit-wide memory device.

Each chip pair is organized as 16 block pairs, also called logical blocks, each including 128 Kbytes of memory. Each block is a separately erasable nonvolatile memory array. Because each logical block of memory can store many sectors of data of variable length, each logical block includes a block sector translation table (BSTT) 84 to identify and locate each sector of data.

Figure 3:
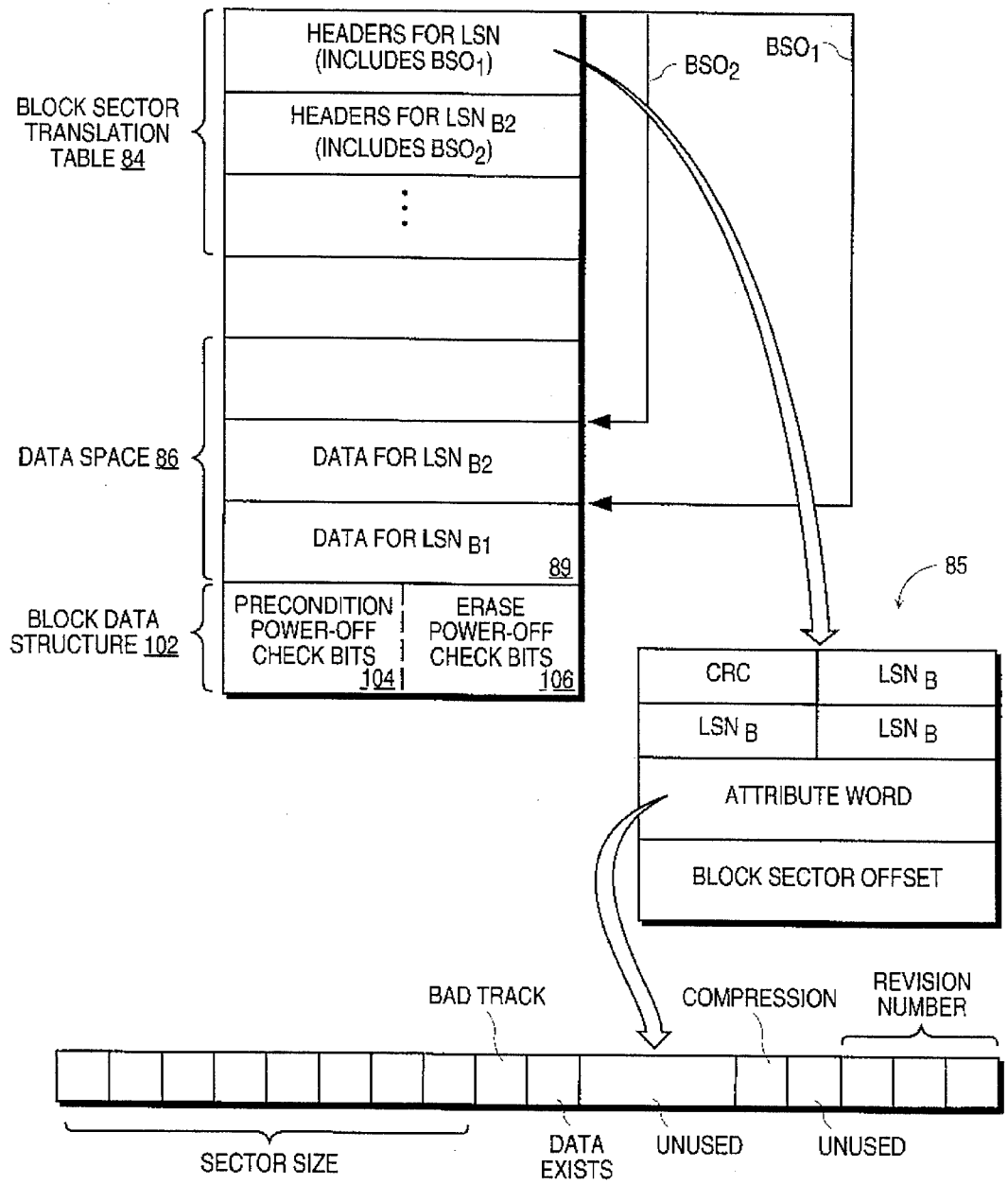
FIG. 3 is a block diagram of a block file structure.

FIG. 3 illustrates logical block 80 and the file structure used by it and all other blocks. Logical block 80 is represented as a single word wide structure but is actually stored in two FLASH chips. The high byte of each word is stored in high chip 68 and the low byte of each word is stored in low chip 70.

The data structure of logical block 80 includes block sector translation table 84, data space 86 and block data structure 102. Block sector translation table 84 stores headers. A header is a block of information about one sector number and its associated data. A sector number is a sector identifier received from host CPU 52, which host CPU 52 believes corresponds to a fixed physical location. Each header stores a logical sector number (LSN), rather than a sector number. A logical sector number refers to a sector number concatenated within a power-off bit and stored within a header. A LSN does not correspond to a fixed physical location.

According to methods to be described, each header indicates whether a sector of data has been lost and whether or not it and its associated sector of data is valid. An incomplete header indicates that power was lost before it and its associated sector of data were completely written. The validity of each header is indicated, in part, via the power-off bit of the LSN. In its erased state, a logic 1, the power-off bit marks the LSN as invalid. In its programmed step, the power-off bits allows the LSN to fall within the valid range of sector numbers given the storage capacity of solid state disk 60. For example, in a standard 40 MB drive the range of valid sector numbers, and thus LSNs, is 1 to 83,300. As will be described in more detail below, the LSN is written into a header in a two step process to ensure that each valid LSN is associated with a valid header and a valid sector of data.

Header 85 includes an attribute word that contains a great deal of information about the header's sector data. One bit of the attribute word indicates whether or not the sector data has been compressed. The attribute word indicates sector size, which can vary because of compression. Prior to being programmed, the sector size in the attribute word indicates the maximum sector size. Thus, if for some reason the sector size is not written into the header, additional sectors of data can still be written into the logical block without fear of programming memory locations that have already been programmed. The attribute word also includes a revision number, which allows solid state controller 64 to identify the most recent revision version of a sector of data when multiple headers include the same LSN.

The last piece of information stored in header 85 is a block sector offset (BSO). The BSO is an offset from the top of the block to the start of the sector of data associated with the header within data space 86.

Block sector translation table 84 grows down toward data space 86. The first header BSTT 84 is written at the top of block 80. The header for each succeeding sector of data written into logical block 80 is stored below the previous header.

In contrast to BSTT 84, data space 86 grows upward. The first sector of data written into logical block 80 is written into the bottom of data space 86, just above block data structure 102. The next sector of data written into data space 86 is written immediately above the previous sector. The number of sectors that may be stored in data space 86 before it runs into BSTT 84 varies. This variability arises because of data compression, which causes sector size to vary.

Block data structure 102 stores information specific to the logical block in which it resides. Block data structure 102 is stored at a fixed and constant memory location within the logical block. Block data structure 102 includes information such as the number of times the logical block has been erased. Block data structure 102 also includes a power-off status word, which indicates whether or not power to solid state disk 60 was turned off during erasure of that logical block. To detect loss of power during either the preconditioning or erase phases of an erase operation, the power-off status word includes precondition power-off status bits and erase power-off status bits. Precondition power-off status bits 104 indicate that power was not turned off during preconditioning of the block when all precondition power-off status bits are a logic 1. Any precondition status bit equal to a logic 0 indicates that preconditioning of the block had begun, but before erasure was complete power was turned off. Similarly, any erase power-off status bit 106 equal to a logic 1 indicates that power was turned off during erasure of the block. Because memory cells within a block respond randomly during erasure, it is important that the power status word include multiple bits so that a block is not misidentified as erased when only a portion of the block has been erased.

III. Solid Step Controller Hardware

Referring once again to FIG. 2, reading, writing, and clean-up of FLASH array 62 is controlled by solid state disk controller 64. Microprocessor 92 manages these tasks using database 93, sector header translation table (SHTT) 94, a number of services, including the services of the present invention, which are stored in FLASH memory 95, window ASIC 96, and sector buffer 98. Application specific integrated circuit, window ASIC 96, serves as a window between host CPU 52 and FLASH array 62. Via window ASIC 96, microprocessor 92 receives commands from host CPU 52 and reads and writes to FLASH array 62.

Data to and from host CPU 52 flows through window ASIC 96 to sector buffer 98. Sector buffer 98 allows transfers of sectors of data between host CPU 52 and FLASH array 62 to occur more rapidly than possible otherwise. The clean-up state machine also uses sector buffer 98 to temporarily store valid sectors of data.

FLASH array database 93 enhances the performance of solid state disk 60 by storing repeatedly used information. Information within FLASH array database 93 includes:

1. The total number of dirty words within FLASH array 62;
2. The total number of dirty words in each block;
3. The total number of free words within FLASH array 62;
4. The number of free words within each chip pair; and
5. The total number of free words within each block.

FLASH array database 93 is used during clean-up to select blocks for clean-up and to identify destination blocks.

Figure 4:
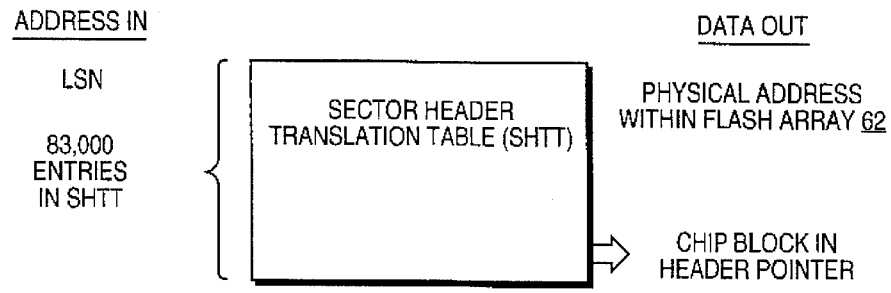
FIG. 4 is a block diagram of a sector header translation table.

Sector header translation table (SHTT) 94 translates a sector number into a pointer to an associated sector of data. To permit its frequent and easy modification, SHTT 94 is preferably stored in RAM. Illustrated in FIG. 4, SHTT 94 stores a pointer to the sector data associated with each valid sector number as well as a pointer to a special LSN used by the clean-up state machine. In one embodiment, sixteen bits are stored for each entry in SHTT 94. Four of the bits indicate the chip pair in which the sector of data being sought is stored. Another four bits indicate the particular logical block in which the sector is stored. The remaining 8 bits are a header pointer, which points to, or near, the desired header.

Storing SHTT 94 in RAM creates advantages and disadvantages. SHTT 94 can be easily and rapidly modified; however, because RAM is volatile SHTT 94 must be regenerated each time power to solid state disk 60 is turned off and on. This is done by scanning the headers in each block sector translation table 84 within FLASH memory array 62. Thus, the validity of SHTT 94 depends upon the validity of headers.

Without some mechanism for detecting power loss inaccuracy and invalidity can be introduced into headers if power is turned off while a sector of data is being written or while a logical block is being erased. Loss of power during erasure of a logical block will leave random data within the logical block. This random data could be identified as the most recent and valid version of data associated with a sector number even using a mechanism like a CRC to determine the validity of the sector. This is because when two valid headers store the same LSN, revision numbers are used to decide which header should be pointed to by SHTT 94. It is possible that the random data could represent the higher revision number in which case, the random data would be output to host CPU 52 during subsequent reads.

The power-off status word of block data structure 102 and the power-off bit of each LSN provide mechanisms for determining the validity of block data and sector data. The power off status word allows the service regenerating SHTT 94 to ignore all headers stored in a logical block that was being erased when power was lost. The power-off bit in each LSN allow the service regenerating SHTT 94 to ignore any header and its associated sector of data that was being written when power was turned off.

Figure 5A:
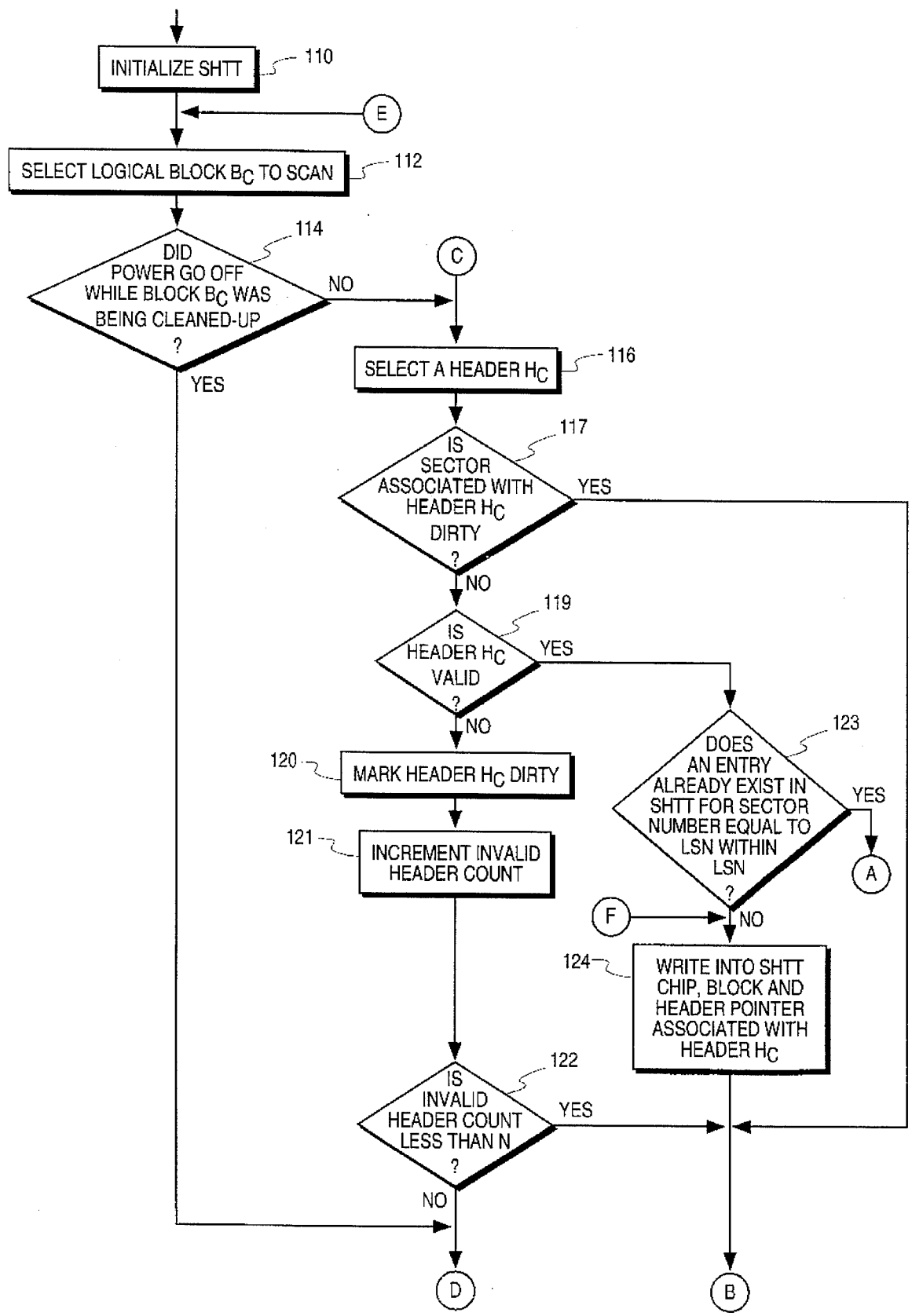
FIG. 5A and 5B is a flow diagram of a method of regenerating the sector header translation table using valid headers.
Figure 5B:
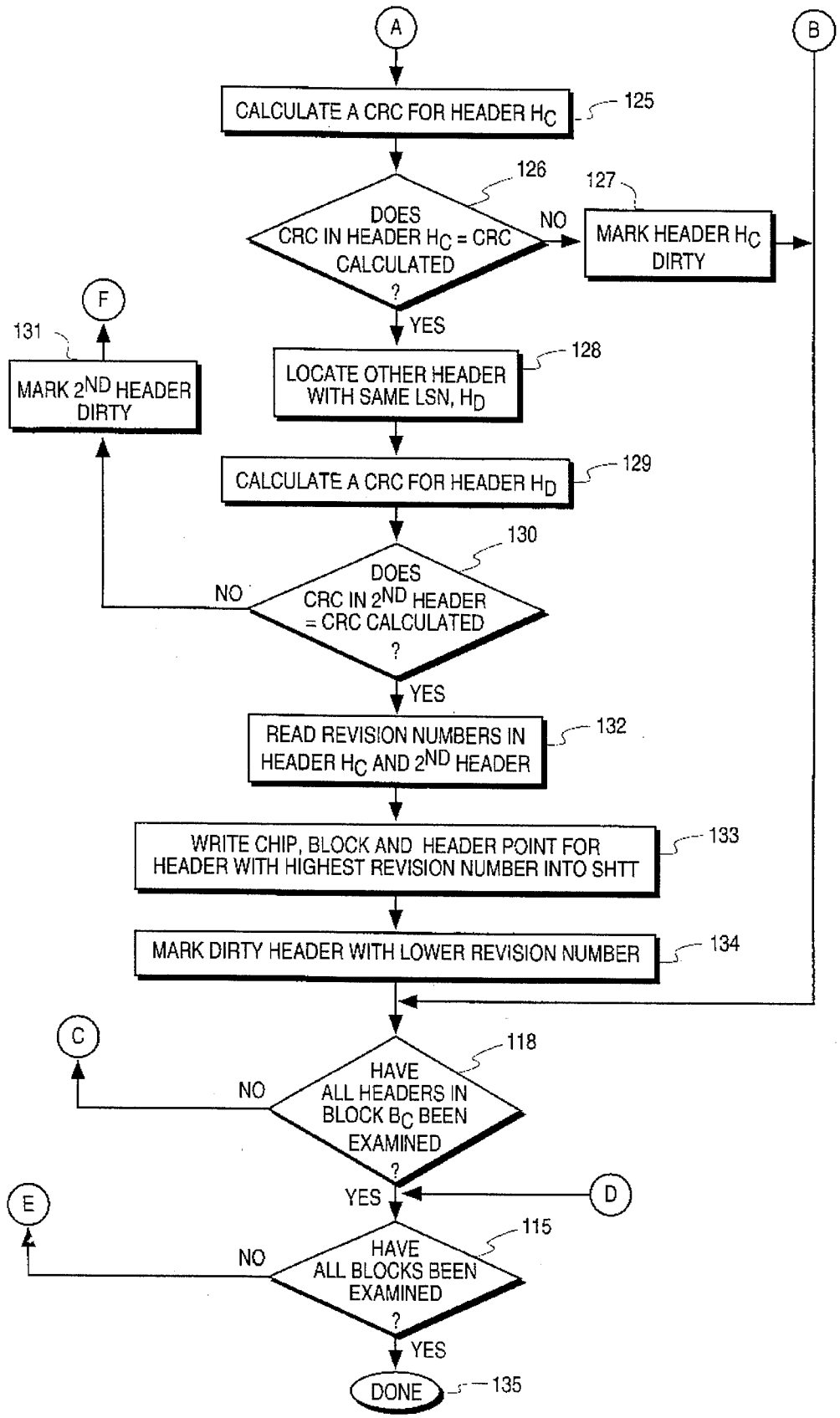

FIG. 5 illustrates in flow diagram form a service for identifying invalid blocks and headers while regenerating SHTT 94. Building SHTT 94 begins in step 110 with the initialization of the RAM in which SHTT 94 is stored. Each pointer for each sector number is set to the same initial value. In one embodiment, that value is FFFF (hexadecimal). As a result, after building SHTT 94, retrieving a pointer equal to the initial value indicates that a sector of data associated with the sector number has not yet been located. Microprocessor 92 branches from step 110 to step 112 to begin scanning BSTTs.

During step 112 microprocessor 92 selects a logical block to scan, $B_c$. From step 112 microprocessor 92 branches to step 114.

Microprocessor 92 determines during step 114 whether power to solid state disk 60 was turned off while the current logical block, $B_c$, was being erased. Microprocessor 92 makes this determination by examining the power-off status word stored within the block data structure 102 of $B_c$. Microprocessor 92 compares the power-off status word to the value expected for a logical block that has been successfully erased. In one embodiment, the expected value is F0F0(H), half of which is stored in the high chip of the logical block and the other half of which is stored in the low chip of the logical block. Any value other than the expected value for the power-off status word indicates that erasure of logical block $B_c$ was interrupted. Microprocessor 92 treats all data within logical block $B_c$ as invalid and uses none of the headers within the BSTT 84 of logical block $B_c$ in regenerating SHTT 94 when the power-off status word does not store the expected value. Microprocessor 92 responds to an unexpected value of the power-off status word by branching down to step 115 to begin the process of selecting another logical block to scan. On the other hand, if the power-off status word indicates that power was not lost during erasure of logical block $B_c$, then microprocessor 92 branches to step 116 from step 114.

Having decided that logical block $B_c$ stores some valid data, microprocessor 92 begins the process of determining which sectors of data stored in logical block $B_c$ are valid during step 116. Microprocessor 92 selects a header $H_c$, within the BSTT 84 of logical block $B_c$. Microprocessor 92 locates the next header by reading the memory location where the next block sector offset should be stored. BSTT 84 includes another header when the next BSO does not equal FFFF(H). Having selected header $H_c$, microprocessor 92 determines whether header $H_c$ and its associated sector of data are dirty. Microprocessor 92 makes this determination by examining the cyclical redundancy check (CRC) and the logical sector number stored within header $H_c$. The sector of data is dirty if the CRC and LSN have been programmed to a predetermined value, which is set to 0000(H) in one embodiment. If header $H_c$ is dirty, it will not be used in regenerating SHIT 94 because a more recent version of the sector of data exists elsewhere in flash memory array 62. Microprocessor 92 responds to the determination that header $H_c$ is dirty by branching to step 118 to select another header. On the other hand, if header $H_c$ is not dirty microprocessor 92 branches to step 119.

Microprocessor 92 determines whether the sector of data associated with header $H_c$ is valid during step 119. Microprocessor 92 makes this determination by examining header $H_c$. First, microprocessor 92 determines whether header $H_c$ is complete. Microprocessor 92 deems header $H_c$ and its associated sector of data invalid if header $H_c$ is incomplete. (Microprocessor 92 will be able to allocate into the block later even if the sector size was not written into header $H_c$ because erasure initializes sector size to the maximum value. This allows microprocessor 92 to write into the block at a memory location that has not yet been programmed.) Second, if header $H_c$ is complete, microprocessor 92 examines the LSN stored in header $H_c$ to determine the validity of the sector of data. An invalid LSN indicates that power was lost while header $H_c$ or its associated sector of data was being written. Microprocessor 92 will not use header $H_c$ in building SHTT 94 if header $H_c$ is incomplete or includes an invalid LSN. Instead, microprocessor 92 branches to step 120 from step 119 if header $H_c$ is incomplete. A valid LSN indicates that header $H_c$ and its associated sector of data are valid because they were written into logical block $B_c$ without loss of power. In this situation, microprocessor 92 branches to step 123 from step 119.

Consider first the sequence of events when it is discovered that header $H_c$ and its sector of data are invalid. Microprocessor 92 first marks dirty header $H_c$ by programming header $H_c$'s CRC and LSN to the predetermined value representing dirty data. In one embodiment the value chosen to represent dirty data is 0000(H). Microprocessor 92 then begins to reassess the validity of the data stored within logical block $B_c$. Microprocessor 92 makes this reassessment based upon the value of an invalid header counter, which is incremented during step 121. During step 122, microprocessor 92 compares the value of the invalid header counter to a maximum number, N, which is set to 3 in a preferred embodiment. When, the number of invalid headers within logical block $B_c$ equals the maximum number, N, then no other headers within logical block $B_c$ will be used in the regeneration of SHTT 94. Instead, microprocessor 92 will turn its attention to another logical block by advancing to step 118. On the other hand, microprocessor 92 will continue to use the headers within logical block $B_c$ to rebuild SHTT 94 if the value of the invalid header counter is less than the maximum number, N. In that case, microprocessor 92 advances to step 115 from step 122 to select another header for examination.

The sequence of events differs when microprocessor 92 determines that header $H_c$ and its associated sector of data are valid. Branching from step 119 to step 123, microprocessor 92 begins the process of determining whether it should store the chip, block and header pointer associated with header $H_c$ in SHTT 94. Microprocessor 92 first seeks an entry in SHTT 94 for the sector number equal to the LSN included in header $H_c$. If the current entry in SHTT 94 is equal to the initial value, FFFF (hexadecimal), no information has been located yet. Microprocessor 92 responds by branching to step 124. Any value in SHTT 94 for the sector number other than the initial value of FFFF(H) indicates that there are two apparently valid sectors of data associated with that one sector number. To determine which sector of data to SHTT 94 should point to, microprocessor 92 advances to step 125.

Consider first the simpler situation; that is, when no data is stored in SHTT 94 for the sector number corresponding to the LSN within header $H_c$. During step 124, microprocessor 92 writes the chip, block and header pointer for header $H_c$ into SHTT 94. This done, microprocessor 92 branches to step 118.

Things are more complicated when SHTT 94 already includes an entry for the sector number associated with the LSN of header $H_c$. During step 125, microprocessor 92 determines whether header $H_c$ is error free by calculating an 8 bit cyclical redundancy check (CRC) for header $H_c$. Microprocessor 92 compares the CRC calculated in step 125 to the CRC stored within header $H_c$ during step 126. The contents of header $H_c$ are not reliable if the two CRCs are not equal. In that case, microprocessor 92 advances to step 127 to mark header $H_c$ dirty. On the other hand, if the two CRCs are equal microprocessor 92 advances to step 128 from step 126.

During step 128 microprocessor 92 continues the process of determining which of the two sectors of data associated with the same sector number should be pointed to by SHTT 94. Microprocessor 92 begins by locating the header already pointed to by SHTT 94. During step 129, microprocessor 92 calculates a CRC for this second header. The calculated CRC is then compared to the CRC stored in the second header in step 130. If the two CRCs are not equal, the second header and its sector of data are not valid. Consequently, microprocessor 92 marks the second header dirty in step 131 and then updates SHTT 94 to include the chip, block and header information for header $H_c$ during step 124.

On the other hand, when the second header apparently stores valid information microprocessor 92 consults revision numbers to determine which header should be pointed to by SHTT 94. Accordingly, microprocessor 92 branches to step 132 from step 130 to read the revision numbers in each header. Microprocessor 92 identifies the more recent sector of data by comparing the revision number associated with each header. Microprocessor 92 writes into SHTT 94 the chip, block and header pointer for the header with the higher revision number during step 133. Microprocessor 92 then branches to step 134 to mark dirty the header storing the lower revision number.

Microprocessor 92 then begins the process of selecting another header for examination in step 118. Microprocessor 92 first determines whether there are any other headers stored in the BSTT 84 of logical block $B_c$ to be examined. If there are, microprocessor 92 returns to step 116 to select one of the remaining headers in block $B_c$ as header $H_c$. If all headers stored within the BSTT 84 of logical block $B_c$ have been examined, then microprocessor 92 determines during step 115 whether all BSTTs 84 within blocks array 62 have been examined. When there are additional BSTTs to be examined, microprocessor 92 branches to step 112 to select another logical block as block $B_c$. Microprocessor 92 has completed the rebuilding of SHTT 94 when there are no more logical blocks to be examined. Microprocessor 92 therefore branches to step 135 from step 115.

IV. Solid Step Disk Controller

The heart of solid state disk controller 64 is the set of services stored within FLASH memory 95. These services control the reading, writing, and cleaning-up of FLASH array 62. These services help create the illusion that CPU 52 is dealing with an industry-standard hard magnetic disk drive.

Figure 6:
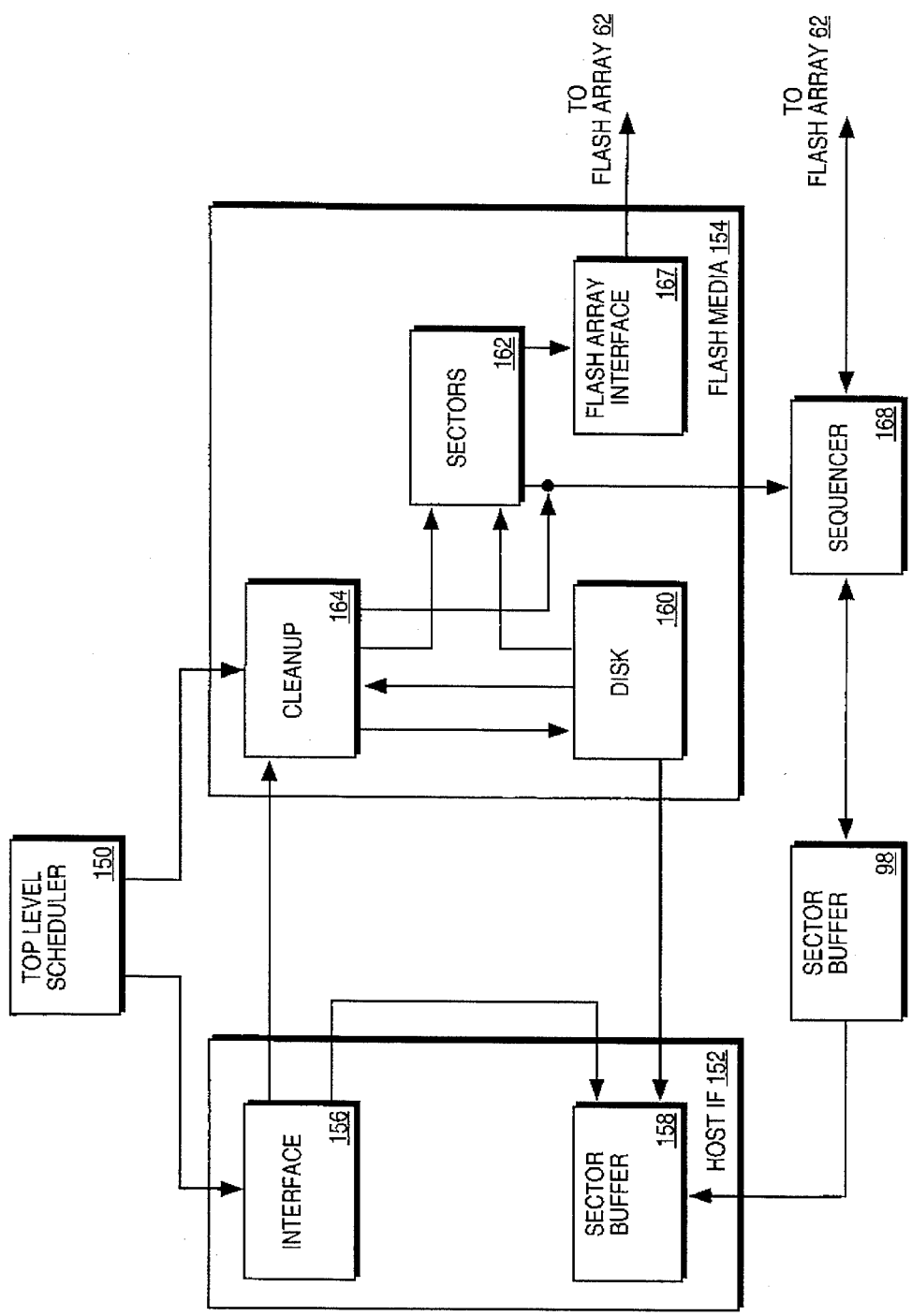
FIG. 6 is an object diagram of the services of the solid state disk controller.

The object diagram of FIG. 6 illustrates the general organization and interrelationship of services used by solid state controller 64. The services of solid state disk controller 64 are organized into three classes: top level scheduler 150, host interface 152, and FLASH media 154. Top level scheduler 150 handles the allocation of CPU 92 processing time between the other two classes 152 and 154. Host interface 152 interprets industry standard disk drive commands from CPU 52 and translates them into commands that FLASH media 154 can act upon. FLASH media 154 interfaces directly with FLASH array 62, responding to read and write requests from host interface 152. FLASH media 154 also manages the cleaning-up of FLASH array 62.

The scheduling of host interface 152 and FLASH media 154 is a relatively simple task. Power-up of solid state disk 60 fires top level scheduler 150. It initializes the solid state disk 60 and then calls host interface 152. This allocates to CPU 52 all the resources of solid state disk 60. When host interface 152 returns control to top level scheduler 150, clean-up object 164 is called. If a clean-up is on-going, then a slice of CPU execution time, 500 μseconds in one embodiment, is allocated for clean-up. When clean-up returns control to top level scheduler 150, host interface 152 is called again. Top level scheduler 150 repeats the process again and again for as long as solid state disk 60 is powered up.

Host interface 152 includes two classes of services, interface 156 and sector buffer 158. Interface 156 emulates an AT-IDE hard disk interface. Interface 156 handles ATA command interrupts and translates ATA commands into commands comprehensible by FLASH media 154. In alternate embodiments, host interface 156 may simulate a SCSI disk interface or other standard disk drive interface. Sector buffer 158 manages the usage of sector buffer 98.

FLASH media 154 includes five types of services: disk 160, sectors 162, clean-up 164, and FLASH array interface 167. Disk 160 services read and write requests from interface 156. Disk 160 also translates other commands from disk 160 and delegates them for execution to fellow classes 162, 164, and 167. Sectors 162 is responsible for most tasks relating to sectors stored within FLASH array 62. Sectors 162 implements the present method of writing of sectors of data so that loss of power can be subsequently identified. Sectors 162 also controls the reading of data from FLASH array 62 via FLASH array interface 167 and sequencer 168. FLASH array interface 167 handles the low level routines which directly control the reading and writing of FLASH array 62. Sequencer 168 handles the movement of data between sector buffer 98 and FLASH array 62.

Just as its name implies, clean-up 164 manages the clean-up of FLASH array 62 and implements the present methods of identifying loss of power during erasure of a block.

A. Writing Sector Data

Figure 7:
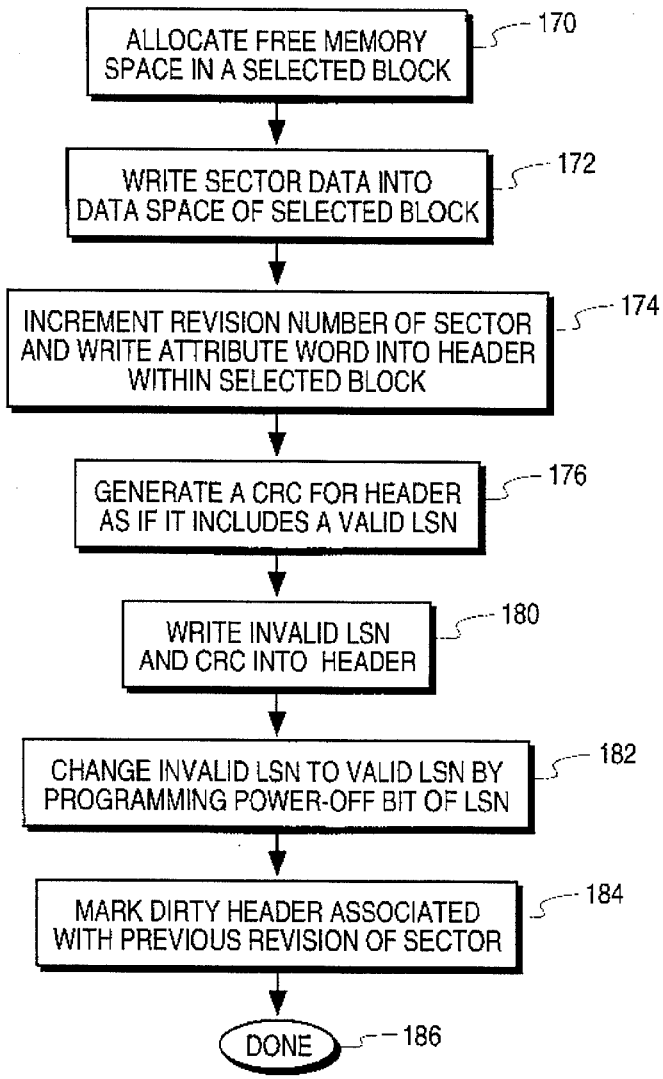
FIG. 7 is a flow diagram a method of writing a sector of data that permits later identification of loss of power during its execution.

FIG. 7 illustrates in flow diagram form the method of the present invention implemented by sectors 162 for writing a sector of data to permit later identification of whether power to solid state disk 60 was turned off before the write was complete. This method helps prevent giving CPU 52 invalid data by changing the invalid LSN into a valid LSN as the final step in writing the revised sector of data. This method also prevents the loss of all data associated with a sector number by marking dirty the previous version of a sector of data after the newer version has been written without loss of power. As a result, if power to solid state disk 60 is turned off before execution of the write sector service is complete, host CPU 52 will be able to retrieve the earlier version of the sector of data.

Microprocessor 92 begins the process of writing a sector of data in step 170 by allocating free memory space in an appropriate block for the sector of data. As part of allocation the block sector offset, BSO, is written into a new header in the BSTT 84 of the selected block. This done, microprocessor 92 advances to step 172 to begin writing the sector of data and to complete the header. If power goes off at this point, the header and its associated sector of data will be identified as invalid because the LSN will be all logic 1s, the state of all free memory prior to programming.

During step 172 microprocessor 92 writes the sector data into the data space 86 of the selected block. The sector of data written, microprocessor 92 advances to step 174 to finish writing the sector's associated header.

Microprocessor 92 increments the revision number associated with the sector of data and writes into the header during step 174. Next, during step 176, microprocessor 92 calculates a CRC for the header as if the header included a valid LSN, which it currently does not. Microprocessor 92 then writes the CRC into the header. Thus, the CRC will signal that the header is invalid until the valid LSN is written into the header. All that microprocessor 92 needs now to finish writing the sector of data is to write the LSN into the header.

Writing the LSN into the header is a two step process. Microprocessor 92 first writes a selected invalid LSN into the header during step 180. The selected invalid LSN differs from the valid LSN by the value of the power-off bit. Thus, all bits other than the power-off bit of the LSN that must be programmed to represent the sector number are programmed during step 180. As a consequence, after step 176 the power-off bit continues to indicate that the LSN and header are invalid. Having ensured that the portion of the LSN representing the sector number has been successfully programmed, microprocessor 92 programs the power-off bit of the LSN from a logic 1 to a logic 0 during step 182. As a result, the selected invalid LSN is converted to a valid LSN and the previously calculated and written CRC is now valid. Additionally, after step 182 two sectors of apparently valid data exist for the same LSN. The revision numbers in both headers allow the service regenerating the SHTT 94 to identify the more recent sector of data.

Microprocessor 92 advances to step 184 from step 182. During step 184, microprocessor 92 marks dirty the older version of the sector of data. As a result, there is now only one valid sector of data associated with the LSN. Writing of the sector of data complete, microprocessor 92 branches to step 186 from step 184.

B. Clean-Up And Permitting Detection of Loss of Power During Block Erasure

Clean-up, or conversion of dirty memory to free memory, involves three major tasks. First, a block is selected as the focus of clean-up. Second, on a valid sector-by-valid sector basis, user data is copied from the focus block into destination blocks. Relocation of user data is itself a multistep process, requiring allocation of memory and copying of the sector into the destination blocks. Third, after all valid user data and the block data structure have been copied out of it, the focus block is erased, converting sectors of invalid user data into free memory. These tasks are accomplished in a manner that permits other services to determine whether power was lost while sectors were being copied into destination blocks or while the focus block was being erased. This protects against later inclusion of invalid data in SHTT 94 and subsequently providing host CPU 52 invalid data.

Clean-up is managed by a finite state machine, called a clean-up state machine. The clean-up state machine includes a finite number of state, or services, which are chained together using a next step pointer. Each step of the clean-up modifies the next step pointer to point to the appropriate next step prior to surrendering control of CPU 92. Each step takes no more than approximately 500 µseconds of CPU 92 time to execute. The clean-up state machine begins running whenever top level scheduler 150 sets the next step pointer to the first step of the clean-up machine. Thereafter, whenever top level scheduler 150 allocates CPU time to clean-up object 164, one clean-up step will be executed.

Figure 8A:
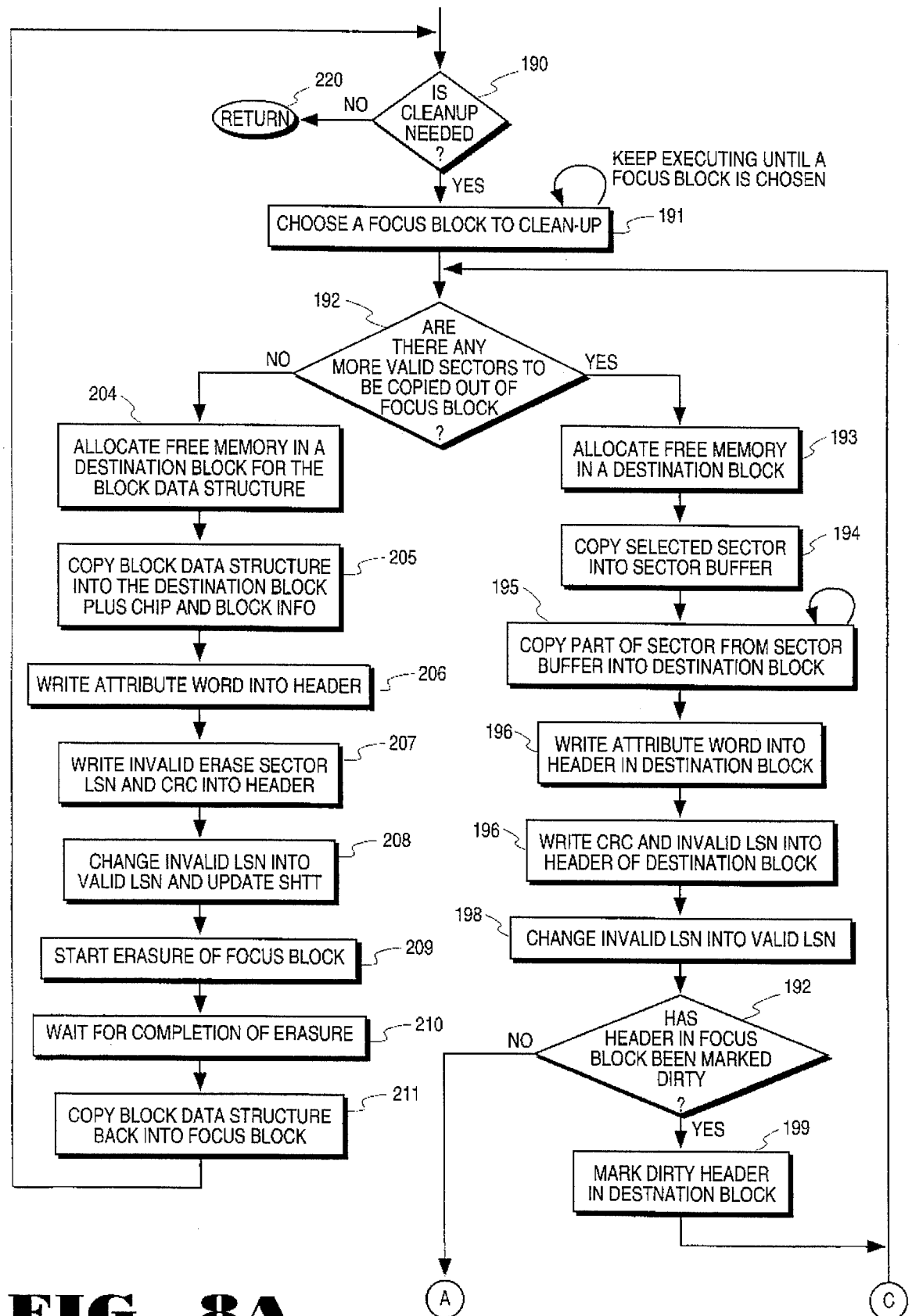
FIG. 8A and 8B is a flow diagram of the steps of a clean-up state machine that permits later identification of loss of power during clean-up state machine execution.
Figure 8B:
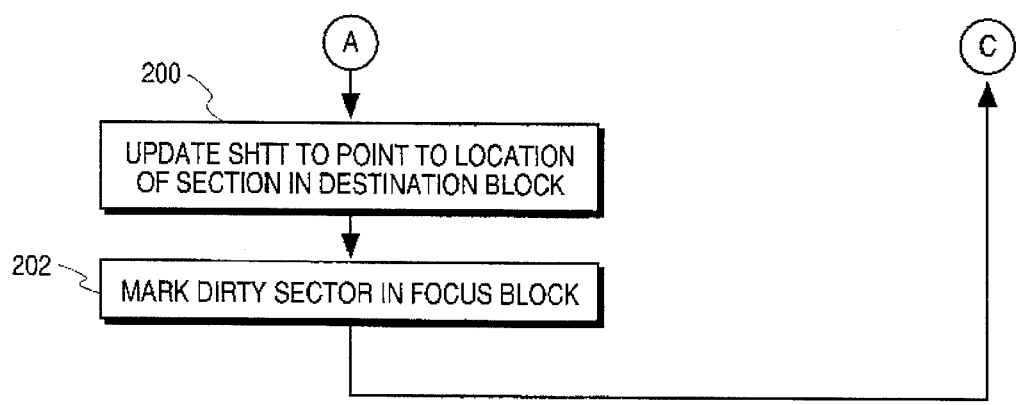

FIG. 8 gives an overview of clean-up by illustrating each step of a clean-up state machine. Each bubble in FIG. 8 represents one step, or service, of the clean-up state machine. The arrows between steps represent the next step pointed to by the next step pointer at the end of a step.

Clean-up begins in step 190 by evaluating whether clean-up is necessary. If clean-up is not necessary microprocessor 92 branches down to step 220. This returns control of microprocessor 92 to top level scheduler 150. If clean-up is necessary, microprocessor 92 is pointed to step 191 by the next step pointer.

Clean-up begins in earnest in step 191 by selecting a focus block to clean-up. The goal in choosing a focus block is to select the block that it is most cost effective to clean. Cost effective clean-up involves striking a balance between keeping FLASH array 62 so clean that power consumption is excessive and keeping FLASH array 62 so dirty that foreground clean-up frequently occurs. The next step pointer then points microprocessor 92 to step 192.

Prior to cleaning up dirty sectors within the focus block via erasure, valid sectors of user data must be safely relocated. This task requires branching through steps 193, 194, 195, 196, 197, 198, 199, 200, and 202 repeatedly until each and every sector of user data within the focus block has been safely copied into other blocks. Relocation of valid sectors of user data begins in step 193 by locating a new physical location in another block for one valid sector of user data. The block selected as the new location is referred to as a destination block. According to this terminology, clean-up has one focus block but may have many destination blocks. Microprocessor 92 is then pointed to step 194 by the next step pointer.

During step 194, the selected sector of user data is copied from the focus block into sector buffer 98. With step 195, microprocessor 92 begins the process of writing the sector of data from the sector buffer into the destination block. During steps 195, 196, 197, and 198 the sector of data is written in a manner that permits later detection of loss of power during any of these steps to protect the validity of the sector of data, its header and SHTT 94.

During step 195 microprocessor 92 copies part of the sector of data from the sector buffer 98 into the destination block. Only a part of the sector of data copied at one time given write speeds and the desire to keep clean-up from impacting response to read and write commands from CPU 52. Thus, microprocessor 92 may pass though step 197 several times before the sector of data is completely copied into the destination block. Once the sector of data has been completely written into the destination block, the next step pointer directs microprocessor 92 to step 196.

Microprocessor 92 writes the attribute word for the header into the BSTT 84 of destination block during step 196.

During step 197 microprocessor 92 calculates a CRC for the header as if the header included a valid LSN, as discussed before with respect to FIG. 7. The CRC and selected invalid LSN are then written into the header. As discussed before, with respect to FIG. 7, the difference between the selected invalid LSN and the valid LSN is the value of the power-off bit. That is to say, all bits other than the power-off bit of the LSN that must be programmed to write the sector number are programmed during step 197. As a result, the LSN will be identified as invalid if power goes off before the next step. Having ensured that the portion of the LSN representing the sector number has been successfully programmed, microprocessor 92 programs the power-off bit of the LSN during step 198 to convert the selected invalid LSN into valid LSN.

Microprocessor 92 determines whether host CPU 52 has revised the sector of data since clean-up began. If so, the sector of data just written into the destination block is invalid. In response, microprocessor 92 marks dirty the sector of data just written into the destination block during step 199 and then advances to step 192 to determine whether there are any remaining sectors of data to be copied out of the focus block. On the other hand, if the sector of data was not revised while it was being copied into the destination block the microprocessor 92 branches to step 200 from step 199. During step 200 microprocessor 92 updates SHTT 94 so that it points to the copy of the sector data within the destination block, rather than the focus block. Afterward, during step 202, microprocessor 92 marks dirty the sector of data within the focus block. Microprocessor 92 then returns to step 192 to continue the relocation of sector data within the focus block.

Upon reentry to step 192, microprocessor 92 determines whether every valid sector within the focus block has been relocated. If not, another valid sector of data will be selected for relocation, and microprocessor 92 will branch through steps 193, 194, 195, 196, 197, 198, 199, 200, and 202 until every valid sector within the focus block has been relocated. When that occurs, the next step pointer directs microprocessor 92 to step 204.

After all sectors of user data have been relocated from the focus block, microprocessor 92 preserves the block data structure 102 of the focus block prior to initiating erasure of the focus block. Microprocessor 92 accomplishes this task during steps 204 and 205 in much the same manner as used to relocate sectors of user data, with some minor differences. Microprocessor 92 copies the block data structure 102 directly from the focus block to the destination block. Microprocessor 92 also stores the address specific to the block data structure along with the block data structure 102. Microprocessor 92 assigns a special LSN to the block data structure 102. This special LSN allows microprocessor 92 to locate the block data structure 102 at a later time so that the block data structure 102 can be returned to its associated block. Microprocessor 92 writes the special LSN into the header in two steps, as described with respect to steps 197 and 198. During step 208, microprocessor 92 also updates SHTT 94 to allow rapid location of the block data structure 102 using the special LSN.

The block data structure relocated, the focus block is ready for erasure. Microprocessor 92 gives the command to erase the focus block to the appropriate chip pair during step 209. Microprocessor 92 initiates an erase operation by giving an erase command to the chip pair and indicating the blocks to be erased. This done, microprocessor 92 proceeds to step 210 to wait for the completion of the erase operation. The clean-up state machine remains in step 210 until the chip pair including the focus block indicates completion of the erase operation.

During step 210 the value of the power-off status word within the focus block is changed. During normal erase operations, preconditioning brings the value of the power off-status word to 0000 (H) and subsequent block erasure brings the value of the power-off status word to FFFF (H). Thus, during step 210 the power-off status word stored within the focus block indicates power has been lost during erasure. The power-off status word will do so until the block data structure 102 is copied back into the focus block. In one embodiment, copying the block data structure 102 word back into the focus blocks brings the power-off status word to F0F0 (H). Only after this is done in step 211 can any data stored within the focus block be regarded as potentially valid. From step 211, microprocessor 92 returns to step 190.

Upon entry to step 190, microprocessor 92 determines if another focus block should be selected for clean-up. If so, microprocessor 92 will branch through steps 191 through 211 as described. If no further clean-up is required, microprocessor 92 advances to step 220, clean-up complete.

Thus, methods of identifying loss of power during block erasure and while writing sector data to protect the validity of user data have been described.

In the foregoing specification, the invention has been described with reference to specific exemplary embodiments thereof. It will, however, be evident that various modifications and changes thereto without departing from the broader spirit and scope of the invention as set forth in the appended claims. The specification and drawings are, accordingly, to be regarded in an illustrative rather than a restrictive sense.

What is claimed is:

1. A method of detecting a power loss while writing a first sector of data to a nonvolatile memory array, the nonvolatile memory array storing a multiplicity of sectors of data and a translation table including a multiplicity of headers, each header being associated with a sector of data, each header including an offset pointer and a logical sector number, each logical sector number identifying a sector of data with which the header is associated, the offset pointer indicating the location of the associated sector of data within the nonvolatile memory array, the method comprising the steps of:
   a. writing the first sector of data into the nonvolatile memory array;
   b. writing a selected invalid logical sector number into the first header;
   c. changing the selected invalid logical sector number into a valid first logical sector number associated with the first sector if there has been no loss of power since writing of the first sector of data began; and
   d. determining whether the power loss occurred while writing the first sector of data by examining the logical sector number in the first header when power to the nonvolatile memory array is restored after the power loss and checking whether the logical sector number is valid.

2. The method of claim 1 wherein each logical sector number includes a multiplicity of bits, the multiplicity of bits including a power-off bit.

3. The method of claim 2 wherein the power-off bit is a most significant bit of each logical sector number.

4. The method of claim 3 wherein during step b the power-off bit of the selected invalid logical sector number is not programmed.

5. The method of claim 4 wherein step c comprises programming the power-off bit of the selected invalid logical sector number.

6. The method of claim 1 further comprising the step of:
   e. determining that the first sector of data has been lost by examining the first header associated with the first sector of data when power to the nonvolatile memory array is restored and finding that the first header includes the first offset pointer and that the first header includes a logical sector number equal to a first value.

7. The method of claim 2 wherein the power-off bit has a first state and a second state, the first state indicating that power was lost while the first sector of data was being written, and the second state indicating power was not lost while the first sector of data associated was being written.

8. A method of detecting a loss of power during erasure of a block of nonvolatile memory, the block storing data and a plurality of power-off status bits, the plurality of power-off status bits being stored at a first address of the block, the plurality of power-off status bits having a first value that indicates that the data stored in the block is valid, the method comprising the steps of:
   a. performing an erase operation on the block;
   b. writing a first value into the block at the first address after step a if there was no loss of power during erasure of the block; and
   c. determining whether the loss of power occurred while erasing the block by examining the plurality of power-off status bits when power to the block is restored after the loss of power and checking whether each bit of the plurality of power-off status bits contains the first value.

9. The method of claim 8 wherein erasure of the block brings each of the plurality of power-off status bits to a first state and wherein the plurality of power-off status bits represents the first value when each of the plurality of power-off status bits is at a second state, and wherein step c comprises:
   determining the plurality of power-off status bits represents the first value.

10. The method of claim 8 wherein erasure of the block is precoded by preconditioning of the block, erasure bringing the plurality of power-off status bits to a first state, preconditioning bringing the plurality of power-off status bits to a second state, and wherein the plurality of power-off status bits includes precondition bits and erase bits, and wherein the power-off status bits represent the first value when the precondition bits are in the first state and the erase bits are in the second state, and wherein step c comprises:
   determining whether the plurality of status bits represents the first value.

11. The method of claim 8 wherein the first value is the hexadecimal value F0F0.

* * * * *

UNITED STATES PATENT AND TRADEMARK OFFICE
CERTIFICATE OF CORRECTION

PATENT NO.     :   5,544,312
DATED          :   August 6, 1996
INVENTOR(S)    :   Hasbun et al.

It is certified that error appears in the above-identified patent and that said Letters Patent is hereby corrected as shown below:

In column 2 at line 28 delete "army" and insert --array--

In column 7 at line 20 delete "SHIT" and insert --SHTT--

In column 12, at line 6, "197" and insert --195--.

Signed and Sealed this

Fifteenth Day of April, 1997

Attest:

BRUCE LEHMAN

*Attesting Officer*     *Commissioner of Patents and Trademarks*